(12) United States Patent
Feng et al.

(10) Patent No.: US 10,917,127 B2
(45) Date of Patent: Feb. 9, 2021

(54) RADIO FREQUENCY TRANSMITTER

(71) Applicant: Huawei Technologies Co., Ltd., Shenzhen (CN)

(72) Inventors: Zemin Feng, Shanghai (CN); Chenlong Hou, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/691,840

(22) Filed: Nov. 22, 2019

(65) Prior Publication Data

US 2020/0091946 A1  Mar. 19, 2020

Related U.S. Application Data

(63) Continuation of application No. PCT/CN2017/113382, filed on Nov. 28, 2017.

(30) Foreign Application Priority Data

May 24, 2017 (CN) .......................... 2017 1 0375446

(51) Int. Cl.
*H04K 1/02* (2006.01)
*H04B 1/04* (2006.01)
(Continued)

(52) U.S. Cl.
CPC ........... *H04B 1/0475* (2013.01); *H03F 3/245* (2013.01); *H03M 1/66* (2013.01); *H03F 2200/451* (2013.01); *H04B 2001/045* (2013.01)

(58) Field of Classification Search
CPC . H04B 1/0475; H04B 2001/045; H03F 3/245; H03F 2200/451; H03M 1/66
(Continued)

(56) References Cited

U.S. PATENT DOCUMENTS 7,436,346 B2   10/2008  Walter et al.
7,725,102 B2    5/2010  Engstrom et al.
(Continued)

FOREIGN PATENT DOCUMENTS

CN    1515069 A    7/2004
CN  101588179 A   11/2009
(Continued)

OTHER PUBLICATIONS

"Creating button sequences," Jul. 24, 2017, 4 pages.
"Enjoy your VIERA with TV Remote for Android," Jul. 18, 2017, 17 pages.

*Primary Examiner* — Helene E Tayong
(74) *Attorney, Agent, or Firm* — Conley Rose, P.C.

(57) ABSTRACT

A radio frequency transmitter includes a digital-to-analog converter, a passive network, two buffers, a frequency mixer, and a power amplifier. Two output ends of the digital-to-analog converter are respectively coupled to two input nodes of the passive network, and the two output ends of the digital-to-analog converter are respectively coupled to input ends of the two buffers. Output ends of the two buffers are respectively coupled to two input ends of the frequency mixer. An output end of the frequency mixer is coupled to an input end of the power amplifier. An output end of the power amplifier is coupled to an antenna. The passive network is configured to perform filtering processing on an input current signal, and convert the current signal into a voltage signal.

20 Claims, 8 Drawing Sheets

(51) Int. Cl.
*H03F 3/24* (2006.01)
*H03M 1/66* (2006.01)

(58) Field of Classification Search
USPC .......................................................... 375/297
See application file for complete search history.

(56) References Cited

U.S. PATENT DOCUMENTS

| | | | | |
|---|---|---|---|---|
| 8,723,712 | B1* | 5/2014 | Kabir | H03M 1/661 |
| | | | | 341/144 |
| 9,008,592 | B2* | 4/2015 | Mirzaei | H03F 3/45179 |
| | | | | 455/91 |
| 9,054,762 | B2* | 6/2015 | Mirzaei | H04B 1/0483 |
| 9,184,699 | B2 | 11/2015 | Moreira | |
| 2002/0146993 | A1 | 10/2002 | Persico et al. | |
| 2004/0152437 | A1* | 8/2004 | Behzad | H03D 7/1458 |
| | | | | 455/326 |
| 2006/0135105 | A1* | 6/2006 | Jensen | H03L 7/1976 |
| | | | | 455/260 |
| 2013/0279630 | A1 | 10/2013 | Xu et al. | |
| 2014/0085541 | A1 | 3/2014 | Sandland et al. | |
| 2014/0195577 | A1* | 7/2014 | Nikitin | H03H 17/0201 |
| | | | | 708/304 |
| 2014/0197973 | A1 | 7/2014 | Kabir et al. | |
| 2015/0161883 | A1 | 6/2015 | Satgunam | |
| 2015/0349749 | A1 | 12/2015 | D'Souza et al. | |

FOREIGN PATENT DOCUMENTS

| | | |
|---|---|---|
| CN | 201443822 U | 4/2010 |
| CN | 101909171 A | 12/2010 |
| CN | 101916159 A | 12/2010 |
| CN | 102325067 A | 1/2012 |
| CN | 103002142 A | 3/2013 |
| CN | 103024502 A | 4/2013 |
| CN | 103037264 A | 4/2013 |
| CN | 103516370 A | 1/2014 |
| CN | 103684330 A | 3/2014 |
| CN | 103929181 A | 7/2014 |
| CN | 103973254 A | 8/2014 |
| CN | 104716962 A | 6/2015 |
| CN | 105094087 A | 11/2015 |
| CN | 105278404 A | 1/2016 |
| CN | 106647659 A | 5/2017 |
| WO | 2016076981 A1 | 5/2016 |

* cited by examiner

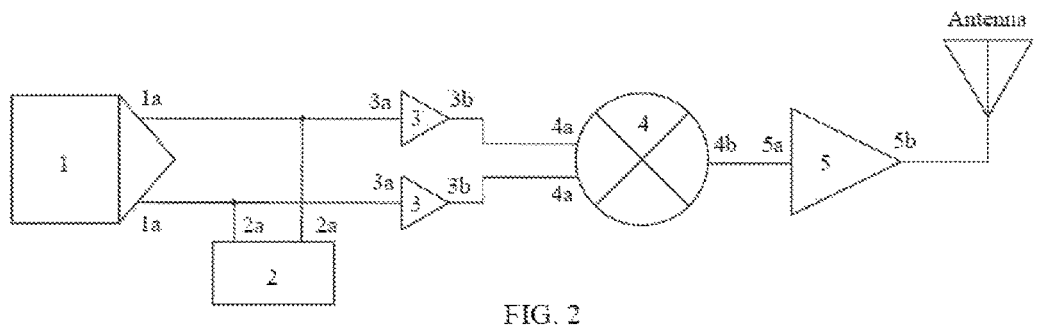

FIG. 2

| Reference Number | Element | Reference Number | Element |
|---|---|---|---|
| 1 | digital-to-analog converter | 4 | frequency mixer |
| 1a | output end of the digital-to-analog converter | 4a | input end of the frequency mixer |
| 2 | passive network | 4b | output end of the frequency mixer |
| 2a | input node of the passive network | 5 | power amplifier |
| 3 | buffer | 5a | input end of the power amplifier |
| 3a | input end of the buffer | 5b | output end of the power amplifier |
| 3b | output end of the buffer | | |

| Reference Number | Element |
|---|---|
| 11 | first current steering unit |

| Reference Number | Element | Reference Number | Element |
|---|---|---|---|
| 21 | passive unit | 21a | one end of the passive unit |
| 21b | the other end of the passive unit | 11 | first current steering unit |

| Reference Number | Element |
|---|---|
| 12 | second current steering unit |

| Reference Number | Element | Reference Number | Element |
|---|---|---|---|
| 21 | passive unit | 21a | one end of the passive unit |
| 21b | the other end of the passive unit | 21 | second current steering unit |

| Reference Number | Element |
|---|---|
| 21a | one end of the passive unit |
| 21b | the other end of the passive unit |

| Reference Number | Element |
| --- | --- |
| 1a | output end of the digital-to-analog converter |
| 4a | input end of the frequency mixer |

RADIO FREQUENCY TRANSMITTER

CROSS-REFERENCE TO RELATED APPLICATIONS

This application is a continuation of International Patent Application No. PCT/CN2017/113382 filed on Nov. 28, 2017, which claims priority to Chinese Patent Application No. 201710375446.6 filed on May 24, 2017. The disclosures of the aforementioned applications are hereby incorporated by reference in their entireties.

TECHNICAL FIELD

This application relates to the field of communications technologies, and in particular, to a radio frequency transmitter.

BACKGROUND

In a communications system, to implement communication between devices, a frequency of a signal usually needs to be modulated to a high frequency using a radio frequency transmitter, for transmission. The radio frequency transmitter usually includes a digital-to-analog converter, a filter, a frequency mixer, and a power amplifier. The filter is usually a trans-impedance amplifier, and the trans-impedance amplifier includes an operational amplifier, a first resistor, a second resistor, a first capacitor, and a second capacitor. As shown in FIG. 1, two output ends of the digital-to-analog converter are respectively connected to two input ends of the operational amplifier, the first resistor and the first capacitor are connected in parallel between one input end and one output end of the operational amplifier, the second resistor and the second capacitor are connected in parallel between the other input end and the other output end of the operational amplifier, the two output ends of the operational amplifier are respectively connected to two input ends of the frequency mixer, an output end of the frequency mixer is connected to an input end of the power amplifier, and an output end of the power amplifier is connected to an antenna.

A working process of the radio frequency transmitter is as follows. After converting a digital signal into a current signal, the digital-to-analog converter outputs the current signal to the filter, where the current signal includes noise such as quantization noise, thermal noise, and flicker noise. The filter performs filtering processing on the input current signal (that is, filters out the noise in the current signal), and converts the current signal into a voltage signal and then outputs the voltage signal to the frequency mixer. The frequency mixer performs frequency mixing on the input voltage signal and a local-frequency signal to obtain a high frequency signal, and then outputs the high frequency signal to the power amplifier. The power amplifier performs power amplification on the input high frequency signal, and then transmits the high frequency signal using the antenna.

Because the trans-impedance amplifier needs to implement both a filtering function and a current-to-voltage conversion function, the operational amplifier included in the trans-impedance amplifier has relatively high gain and bandwidth requirements. As a result, the operational amplifier has relatively high power consumption. In addition, because the operational amplifier has a relatively high gain requirement, the operational amplifier is usually of a multi-stage structure. Because noise of the multi-stage operational amplifier is mainly generated at a first stage to reduce the noise of the operational amplifier, first-stage power consumption of the operational amplifier needs to be increased to reduce first-stage noise to reduce the noise of the operational amplifier. However, because power consumption of the multi-stage operational amplifier usually increases exponentially stage by stage, if the first-stage power consumption of the operational amplifier is increased, other-stage power consumption of the operational amplifier is higher. As a result, power consumption of the operational amplifier is further increased.

SUMMARY

To resolve a problem that an operational amplifier in a radio frequency transmitter has relatively high power consumption, this application provides a radio frequency transmitter. The technical solutions are as follows.

The radio frequency transmitter includes a digital-to-analog converter, a passive network, two buffers, a frequency mixer, and a power amplifier.

Two output ends of the digital-to-analog converter are respectively connected to two input nodes of the passive network, and the two output ends of the digital-to-analog converter are respectively connected to input ends of the two buffers, output ends of the two buffers are respectively connected to two input ends of the frequency mixer, an output end of the frequency mixer is connected to an input end of the power amplifier, and an output end of the power amplifier is connected to an antenna.

Further, a working process of the radio frequency transmitter is as follows. The digital-to-analog converter converts a to-be-transmitted digital signal into a current signal, and outputs the current signal to the passive network, where the current signal includes noise. The passive network performs filtering processing on the input current signal (that is, filters out the noise in the current signal), and converts the current signal into a voltage signal and then outputs the voltage signal to the two buffers. The two buffers output the input voltage signal to the frequency mixer. The frequency mixer obtains a high frequency signal after performing frequency mixing on the input voltage signal and a local-frequency signal, and outputs the high frequency signal to the power amplifier. The power amplifier performs power amplification on the input high frequency signal, and then outputs the high frequency signal to the antenna. The antenna transmits the high frequency signal.

In this embodiment of the present disclosure, because the passive network includes no operational amplifier, compared with a solution in a related technology that filtering and current-to-voltage conversion are performed using a trans-impedance amplifier, power consumption can be greatly reduced using the passive network provided in this embodiment of the present disclosure.

In addition, because the two buffers have relatively large equivalent input impedances, when the two buffers are used to isolate the digital-to-analog converter from the frequency mixer, the voltage signal obtained after the passive network and the two buffers process the current signal output by the digital-to-analog converter, namely, the voltage signal output by the two buffers to the frequency mixer, can have a relatively large output swing such that the voltage signal input to the frequency mixer can have relatively high signal quality.

In addition, because the two buffers each are of a single-stage structure, power consumption of the two buffers all can be used to reduce noise generated by the two buffers. Therefore, compared with a solution that only first-stage power consumption of an operational amplifier included in a trans-impedance amplifier is used to reduce noise generated by the operational amplifier, the two buffers provided in this embodiment of the present disclosure can have a lower noise level and a higher bandwidth when power consumption of the two buffers is the same as that of the operational amplifier, and the two buffers have lower power consumption when a noise level of the two buffers is the same as that of the operational amplifier.

The digital-to-analog converter includes a plurality of first current steering units, and each first current steering unit includes a current source, a first P-type metal-oxide semiconductor (PMOS) transistor, a second PMOS transistor, a third PMOS transistor, and a fourth PMOS transistor.

One end of the current source is connected to an external power supply, and the other end of the current source is connected to both a source of the first PMOS transistor and a source of the second PMOS transistor, a gate of the first PMOS transistor is connected to a first signal source, and the first PMOS transistor is connected forward in series to the third PMOS transistor, a gate of the second PMOS transistor is connected to a second signal source, and the second PMOS transistor is connected forward in series to the fourth PMOS transistor, a gate of the third PMOS transistor is connected to a gate of the fourth PMOS transistor, and both the gate of the third PMOS transistor and the gate of the fourth PMOS transistor are connected to a third signal source, and a drain of the third PMOS transistor and a drain of the fourth PMOS transistor are respectively connected to the two input nodes of the passive network, and the drain of the third PMOS transistor and the drain of the fourth PMOS transistor are respectively connected to the input ends of the two buffers.

That the first PMOS transistor is connected forward in series to the third PMOS transistor means that a drain of the first PMOS transistor is connected to a source of the third PMOS transistor. That the second PMOS transistor is connected forward in series to the fourth PMOS transistor means that a drain of the second PMOS transistor is connected to a source of the fourth PMOS transistor.

In this embodiment of the present disclosure, the third PMOS transistor and the fourth PMOS transistor form a cascode transistor. In this case, the cascode transistor including the third PMOS transistor and the fourth PMOS transistor is used to isolate the digital-to-analog converter from the passive network such that impact caused by fluctuation of the voltage signal output by the passive network on the current signal output by the digital-to-analog converter can be reduced, to prevent the current signal output by the digital-to-analog converter from generating a harmonic.

Further, the passive network includes two passive units, ends of the two passive units are respectively connected to the two output ends of the digital-to-analog converter, and the other ends of the two passive units are grounded.

In this embodiment of the present disclosure, external power supplies connected to the plurality of first current steering units included in the digital-to-analog converter, the plurality of first current steering units, the two passive units included in the passive network, and the ground connected to the two passive units form a current loop such that the two passive units can filter out the noise in the input current signal, and generate a voltage signal on one end of each of the two passive units.

The digital-to-analog converter includes a plurality of second current steering units, and each second current steering unit includes a current source, a first N-type metal-oxide semiconductor (NMOS) transistor, a second NMOS transistor, a third NMOS transistor, and a fourth NMOS transistor.

One end of the current source is grounded, and the other end of the current source is connected to both a source of the first NMOS transistor and a source of the second NMOS transistor, a gate of the first NMOS transistor is connected to a first signal source, and the first NMOS transistor is connected forward in series to the third NMOS transistor, a gate of the second NMOS transistor is connected to a second signal source, and the second NMOS transistor is connected forward in series to the fourth NMOS transistor, a gate of the third NMOS transistor is connected to a gate of the fourth NMOS transistor, and both the gate of the third NMOS transistor and the gate of the fourth NMOS transistor are connected to a third signal source, and a drain of the third NMOS transistor and a drain of the fourth NMOS transistor are respectively connected to the two input nodes of the passive network, and the drain of the third NMOS transistor and the drain of the fourth NMOS transistor are respectively connected to the input ends of the two buffers.

That the first NMOS transistor is connected forward in series to the third NMOS transistor means that a drain of the first NMOS transistor is connected to a source of the third NMOS transistor. That the second NMOS transistor is connected forward in series to the fourth NMOS transistor means that a drain of the second NMOS transistor is connected to a source of the fourth NMOS transistor.

In this embodiment of the present disclosure, the third NMOS transistor and the fourth NMOS transistor form a cascode transistor. In this case, the cascode transistor including the third NMOS transistor and the fourth NMOS transistor is used to isolate the digital-to-analog converter from the passive network such that impact caused by fluctuation of the voltage signal output by the passive network on the current signal output by the digital-to-analog converter can be reduced, to prevent the current signal output by the digital-to-analog converter from generating a harmonic.

Further, the passive network includes two passive units, ends of the two passive units are respectively connected to the two output ends of the digital-to-analog converter, and the other ends of the two passive units are connected to external power supplies.

In this embodiment of the present disclosure, the ground connected to the plurality of second current steering units included in the digital-to-analog converter, the plurality of second current steering units, the two passive units included in the passive network, and the external power supplies connected to the two passive units form a current loop such that the two passive units can filter out the noise in the input current signal, and generate a voltage signal on one end of each of the two passive units.

Each of the two passive units includes a first resistor and a first capacitor, and the first resistor is connected in parallel to the first capacitor, or each of the two passive units includes a second resistor, a third resistor, a second capacitor, and a third capacitor, the second resistor is connected in parallel to the second capacitor, a circuit including the second resistor and the second capacitor is connected in series to the third capacitor, and a circuit including the second resistor, the second capacitor, and the third capacitor is connected in parallel to the third resistor.

The technical solutions provided in this application bring the following beneficial effects. The radio frequency transmitter includes the digital-to-analog converter, the passive network, the two buffers, the frequency mixer, and the power amplifier. When the radio frequency transmitter works, the digital-to-analog converter converts the to-be-transmitted digital signal into the current signal, and outputs the current signal to the passive network. The passive network performs filtering processing on the input current signal, and converts the current signal into the voltage signal and then outputs the voltage signal to the frequency mixer using the two buffers, the frequency mixer obtains the high frequency signal after performing frequency mixing on the input voltage signal and the local-frequency signal, and outputs the high frequency signal to the power amplifier. The power amplifier performs power amplification on the input high frequency signal, and then outputs the high frequency signal to the antenna, and the antenna transmits the high frequency signal. Because the passive network in the radio frequency transmitter includes no operational amplifier, compared with the solution that filtering and current-to-voltage conversion are performed using a trans-impedance amplifier, power consumption can be greatly reduced using the passive network provided in the embodiments of the present disclosure. In addition, because the two buffers in the radio frequency transmitter each are of the single-stage structure, power consumption of the two buffers all can be used to reduce noise generated by the two buffers. Therefore, compared with the solution that only first-stage power consumption of an operational amplifier included in a trans-impedance amplifier is used to reduce noise generated by the operational amplifier, the two buffers provided in the embodiments of the present disclosure can have a lower noise level and a higher bandwidth when power consumption of the two buffers is the same as that of the operational amplifier, and the two buffers have lower power consumption when a noise level of the two buffers is the same as that of the operational amplifier.

BRIEF DESCRIPTION OF DRAWINGS

FIG. 2 is a schematic structural diagram of a first radio frequency transmitter according to an embodiment of the present disclosure;

Figure 1:
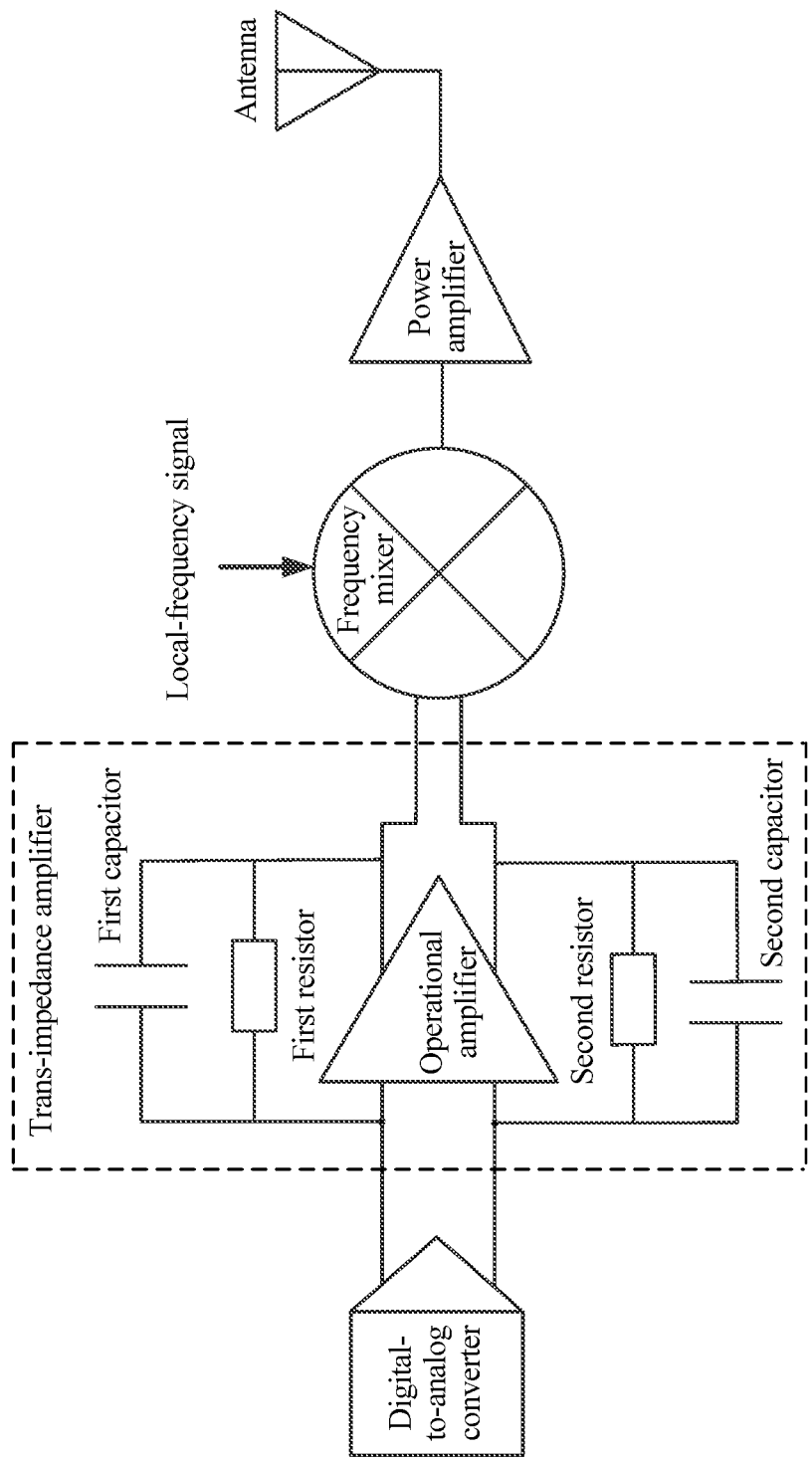
FIG. 1 is a schematic structural diagram of a radio frequency transmitter.

Reference numerals are as follows.

1: digital-to-analog converter; 1a: output end of the digital-to-analog converter; 11: first current steering unit; 12: second current steering unit; VDD: external power supply; CS: current source; csa: one end of the current source; csb: the other end of the current source; SWN: first signal source; SWP: second signal source; and Vb: third signal source;

Q1: first PMOS transistor; s1: source of the first PMOS transistor; d1: drain of the first PMOS transistor; g1: gate of the first PMOS transistor; Q2: second PMOS transistor; s2: source of the second PMOS transistor; d2: drain of the second PMOS transistor; g2: gate of the second PMOS transistor; Q3: third PMOS transistor; s3: source of the third PMOS transistor; d3: drain of the third PMOS transistor; g3: gate of the third PMOS transistor; Q4: fourth PMOS transistor; s4: source of the fourth PMOS transistor; d4: drain of the fourth PMOS transistor; and g4: gate of the fourth PMOS transistor;

Q5: first NMOS transistor; s5: source of the first NMOS transistor; d5: drain of the first NMOS transistor; g5: gate of the first NMOS transistor; Q6: second NMOS transistor; s6: source of the second NMOS transistor; d6: drain of the second NMOS transistor; g6: gate of the second NMOS transistor; Q7: third NMOS transistor; s7: source of the third NMOS transistor; d7: drain of the third NMOS transistor; g7: gate of the third NMOS transistor; Q8: fourth NMOS transistor; s8: source of the fourth NMOS transistor; d8: drain of the fourth NMOS transistor; and g8: gate of the fourth NMOS transistor;

2: passive network; 2a: input node of the passive network; 21: passive unit; 21a: one end of the passive unit; 21b: the other end of the passive unit; R1: first resistor; C1: first capacitor; R2: second resistor; R3: third resistor; C2: second capacitor; and C3: third capacitor;

3: buffer; 3a: input end of the buffer; 3b: output end of the buffer; Q9: fifth PMOS transistor; s9: source of the fifth PMOS transistor; d9: drain of the fifth PMOS transistor; g9: gate of the fifth PMOS transistor; Q10: fifth NMOS transistor; s10: source of the fifth NMOS transistor; d10: drain of the fifth NMOS transistor; and g10: gate of the fifth NMOS transistor;

4: frequency mixer; 4a: input end of the frequency mixer; and 4b: output end of the frequency mixer; and

5: power amplifier; 5a: input end of the power amplifier; and 5b: output end of the power amplifier.

DESCRIPTION OF EMBODIMENTS

To make the objectives, technical solutions, and advantages of this application clearer, the following further describes the implementations of this application in detail with reference to the accompanying drawings.

Before the embodiments of the present disclosure are described in detail, an application scenario of the embodiments of the present disclosure is described first. A radio frequency transmitter in a communications system usually includes a digital-to-analog converter, a filter, a frequency mixer, and a power amplifier. In a related technology, the filter in the radio frequency transmitter is usually a trans-impedance amplifier. When an operational amplifier included in the trans-impedance amplifier needs to have a relatively high gain and bandwidth, and the operational amplifier needs to have a relatively low noise level, the operational amplifier usually has relatively high power consumption. In view of this, the embodiments of the present disclosure provide a radio frequency transmitter, to replace the trans-impedance amplifier with a passive network and two buffers such that a noise level of the radio frequency transmitter is reduced and a bandwidth of the radio frequency transmitter is increased under same power consumption, and power consumption of the radio frequency transmitter is reduced under a same noise level. A structure of the radio frequency transmitter provided in the embodiments of the present disclosure may be a structure of an up-mixing link of the radio frequency transmitter.

FIG. 2 is a schematic structural diagram of a radio frequency transmitter according to an embodiment of the present disclosure. Referring to FIG. 2, the radio frequency transmitter includes a digital-to-analog converter 1, a passive network 2, two buffers 3, a frequency mixer 4, and a power amplifier 5.

Two output ends 1a of the digital-to-analog converter 1 are respectively connected to two input nodes 2a of the passive network 2, and the two output ends 1a of the digital-to-analog converter 1 are respectively connected to input ends 3a of the two buffers 3. Output ends 3b of the two buffers 3 are respectively connected to two input ends 4a of the frequency mixer 4. An output end 4b of the frequency mixer 4 is connected to an input end 5a of the power amplifier 5. An output end 5b of the power amplifier 5 is connected to an antenna.

Further, a working process of the radio frequency transmitter is as follows. The digital-to-analog converter 1 converts a to-be-transmitted digital signal into a current signal, and outputs the current signal to the passive network 2, where the current signal includes noise. The passive network 2 performs filtering processing on the input current signal (that is, filters out the noise in the current signal), and converts the current signal into a voltage signal and then outputs the voltage signal to the two buffers 3. The two buffers 3 output the input voltage signal to the frequency mixer 4. The frequency mixer 4 obtains a high frequency signal after performing frequency mixing on the input voltage signal and a local-frequency signal, and outputs the high frequency signal to the power amplifier 5. The power amplifier 5 performs power amplification on the input high frequency signal, and then outputs the high frequency signal to the antenna. The antenna transmits the high frequency signal.

The digital-to-analog converter 1 is of a structure that can convert a digital signal into a current signal, for example, may be of a current steering structure. This is not limited in this embodiment of the present disclosure. The current signal output by the digital-to-analog converter 1 is a difference between currents output by the two output ends 1a of the digital-to-analog converter 1. For example, a current output by one of the two output ends 1a of the digital-to-analog converter 1 is Ip, and a current output by the other output end is In. Assuming that Ip is a forward current, and In is a reverse current, the current signal output by the digital-to-analog converter 1 is Ip-In.

The passive network 2 is a network including passive elements, for example, may be a resistance-capacitance (RC) network. Because the passive network 2 includes no operational amplifier, compared with a solution that filtering and current-to-voltage conversion are performed using a trans-impedance amplifier, power consumption can be greatly reduced using the passive network 2 provided in this embodiment of the present disclosure.

The two buffers 3 each are of a single-stage structure, for example, each may be a high-speed buffer. Because the two buffers 3 have relatively large equivalent input impedances, when the two buffers 3 are used to isolate the digital-to-analog converter 1 from the frequency mixer 4, the voltage signal obtained after the passive network 2 and the two buffers 3 process the current signal output by the digital-to-analog converter 1 (namely, the voltage signal output by the two buffers 3 to the frequency mixer 4) can have a relatively large output swing such that the voltage signal input to the frequency mixer 4 can have relatively high signal quality.

In addition, because the two buffers 3 each are of the single-stage structure, power consumption of the two buffers 3 all can be used to reduce noise generated by the two buffers. Therefore, compared with a solution that only first-stage power consumption of an operational amplifier included in a trans-impedance amplifier is used to reduce noise generated by the operational amplifier, the two buffers 3 provided in this embodiment of the present disclosure can have a lower noise level and a higher bandwidth when power consumption of the two buffers is the same as that of the operational amplifier, and the two buffers 3 have lower power consumption when a noise level of the two buffers is the same as that of the operational amplifier.

The local-frequency signal is generated by a local oscillator circuit. After generating the local-frequency signal, the local oscillator circuit may output the local-frequency signal to the frequency mixer 4. Then, the frequency mixer 4 performs frequency mixing on the local-frequency signal and the input voltage signal such that the voltage signal is converted into the high frequency signal using the local-frequency signal.

It should be noted that in actual application, the digital-to-analog converter 1 may include the following two structures. Certainly, the digital-to-analog converter 1 may be of another structure provided that the structure can implement a function of converting a digital signal into a current signal.

Figure 3:
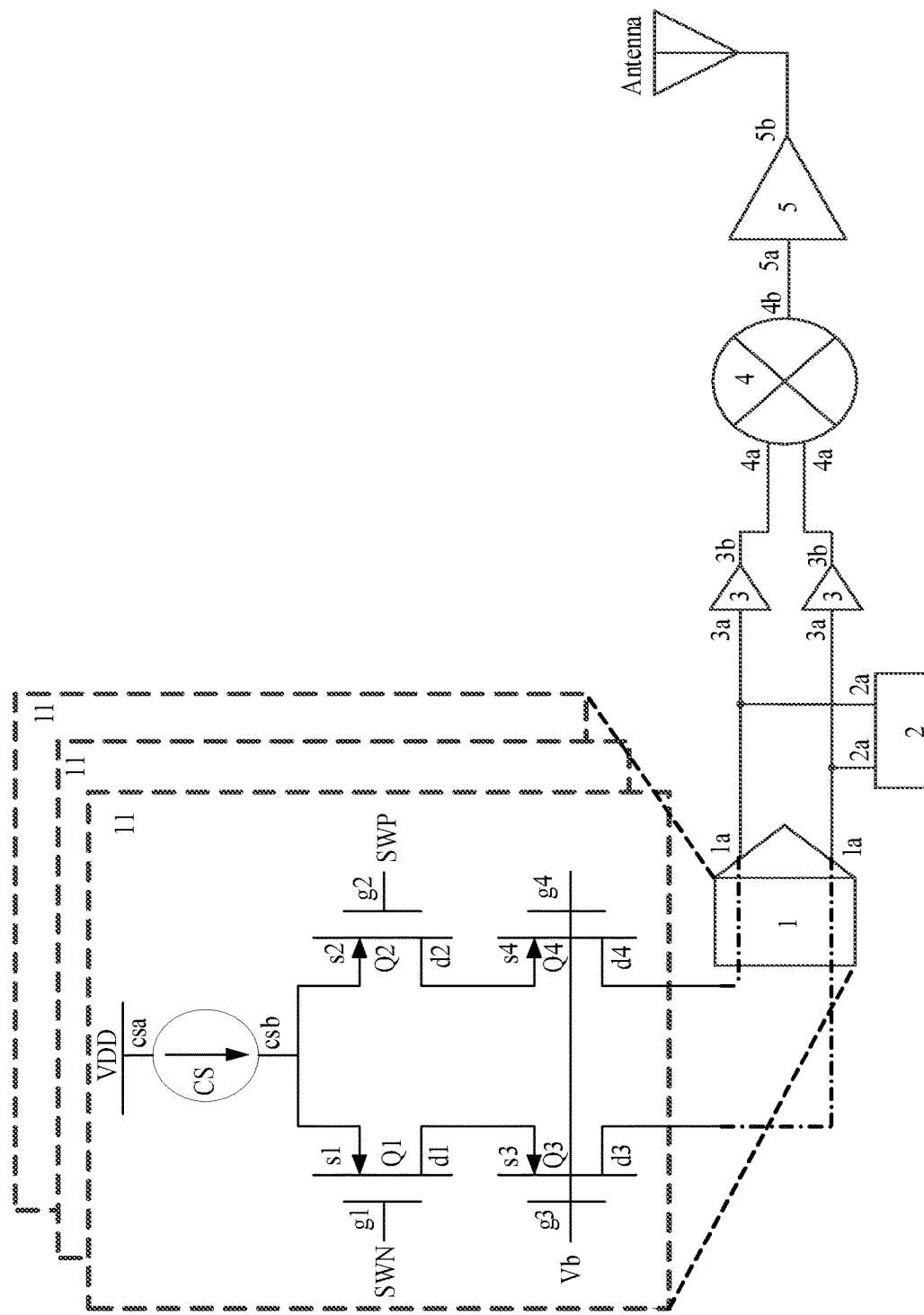
FIG. 3 is a schematic structural diagram of a second radio frequency transmitter according to an embodiment of the present disclosure.

First structure: Referring to FIG. 3, the digital-to-analog converter 1 includes a plurality of first current steering units 11, and each first current steering unit includes a current source CS, a first PMOS transistor Q1, a second PMOS transistor Q2, a third PMOS transistor Q3, and a fourth PMOS transistor Q4.

One end csa of the current source CS is connected to an external power supply VDD, and the other end csb of the current source CS is connected to both a source s1 of the first PMOS transistor Q1 and a source s2 of the second PMOS transistor Q2. A gate g1 of the first PMOS transistor Q1 is connected to a first signal source SWN, and the first PMOS transistor Q1 is connected forward in series to the third PMOS transistor Q3. A gate g2 of the second PMOS transistor Q2 is connected to a second signal source SWP, and the second PMOS transistor Q2 is connected forward in series to the fourth PMOS transistor Q4. A gate g3 of the third PMOS transistor Q3 is connected to a gate g4 of the fourth PMOS transistor Q4, and both the gate g3 of the third PMOS transistor Q3 and the gate g4 of the fourth PMOS transistor Q4 are connected to a third signal source Vb. A drain d3 of the third PMOS transistor Q3 and a drain d4 of the fourth PMOS transistor Q4 are respectively connected to the two input nodes 2a of the passive network 2, and the drain d3 of the third PMOS transistor Q3 and the drain d4 of the fourth PMOS transistor Q4 are respectively connected to the input ends 3a of the two buffers 3.

That the first PMOS transistor Q1 is connected forward in series to the third PMOS transistor Q3 means that a drain d1 of the first PMOS transistor Q1 is connected to a source s3 of the third PMOS transistor Q3. That the second PMOS transistor Q2 is connected forward in series to the fourth PMOS transistor Q4 means that a drain d2 of the second PMOS transistor Q2 is connected to a source s4 of the fourth PMOS transistor Q4.

The plurality of first current steering units 11 are in a one-to-one correspondence to a plurality of bits of the digital signal, and each of the plurality of first current steering units 11 is configured to convert a corresponding bit of the digital signal into one current signal. In this case, the current signal output by the digital-to-analog converter 1 is a sum of current signals output by the plurality of first current steering units 11.

The current source CS is configured to ensure constant current output of the external power supply VDD, that is, an output current of the external power supply VDD remains unchanged in a particular load changing range.

For each of the plurality of first current steering units 11, the first signal source SWN and the second signal source SWP that are connected to the first current steering unit output opposite levels. In this case, only one of the first PMOS transistor Q1 connected to the first signal source SWN and the second PMOS transistor Q2 connected to the second signal source SWP is closed at one time. For example, when the first signal source SWN outputs a high level, the second signal source SWP outputs a low level. In this case, the first PMOS transistor Q1 connected to the first signal source SWN is closed, and the second PMOS transistor Q2 connected to the second signal source SWP is open. When the first signal source SWN outputs a low level, the second signal source SWP outputs a high level. In this case, the first PMOS transistor Q1 connected to the first signal source SWN is open, and the second PMOS transistor Q2 connected to the second signal source SWP is closed.

In addition, the levels output by the first signal source SWN and the second signal source SWP that are connected to the first current steering unit are obtained based on the bit that is of the digital signal and that corresponds to the first current steering unit. Further, one of the first signal source SWN and the second signal source SWP that are connected to the first current steering unit may directly output a level corresponding to the bit that is of the digital signal and that corresponds to the first current steering unit, and the other signal source may output a level obtained after a phase inverter inverts a phase of the level corresponding to the bit that is of the digital signal and that corresponds to the first current steering unit.

The third PMOS transistor Q3 and the fourth PMOS transistor Q4 form a cascode transistor. The cascode transistor is disposed on an output branch of the current source such that an output resistance can be increased, thereby reducing impact caused by a change of an output voltage on an output current. That is, the cascode transistor including the third PMOS transistor Q3 and the fourth PMOS transistor Q4 is used to isolate the digital-to-analog converter 1 from the passive network 2 such that impact caused by fluctuation of the voltage signal output by the passive network 2 on the current signal output by the digital-to-analog converter 1 can be reduced to prevent the current signal output by the digital-to-analog converter 1 from generating a harmonic.

A level output by the third signal source Vb is generated by a bias circuit, and the third signal source Vb is configured to control closure of both the third PMOS transistor Q3 and the fourth PMOS transistor Q4 that are connected to the third signal source to ensure normal working of the third PMOS transistor Q3 and the fourth PMOS transistor Q4.

Figure 4:
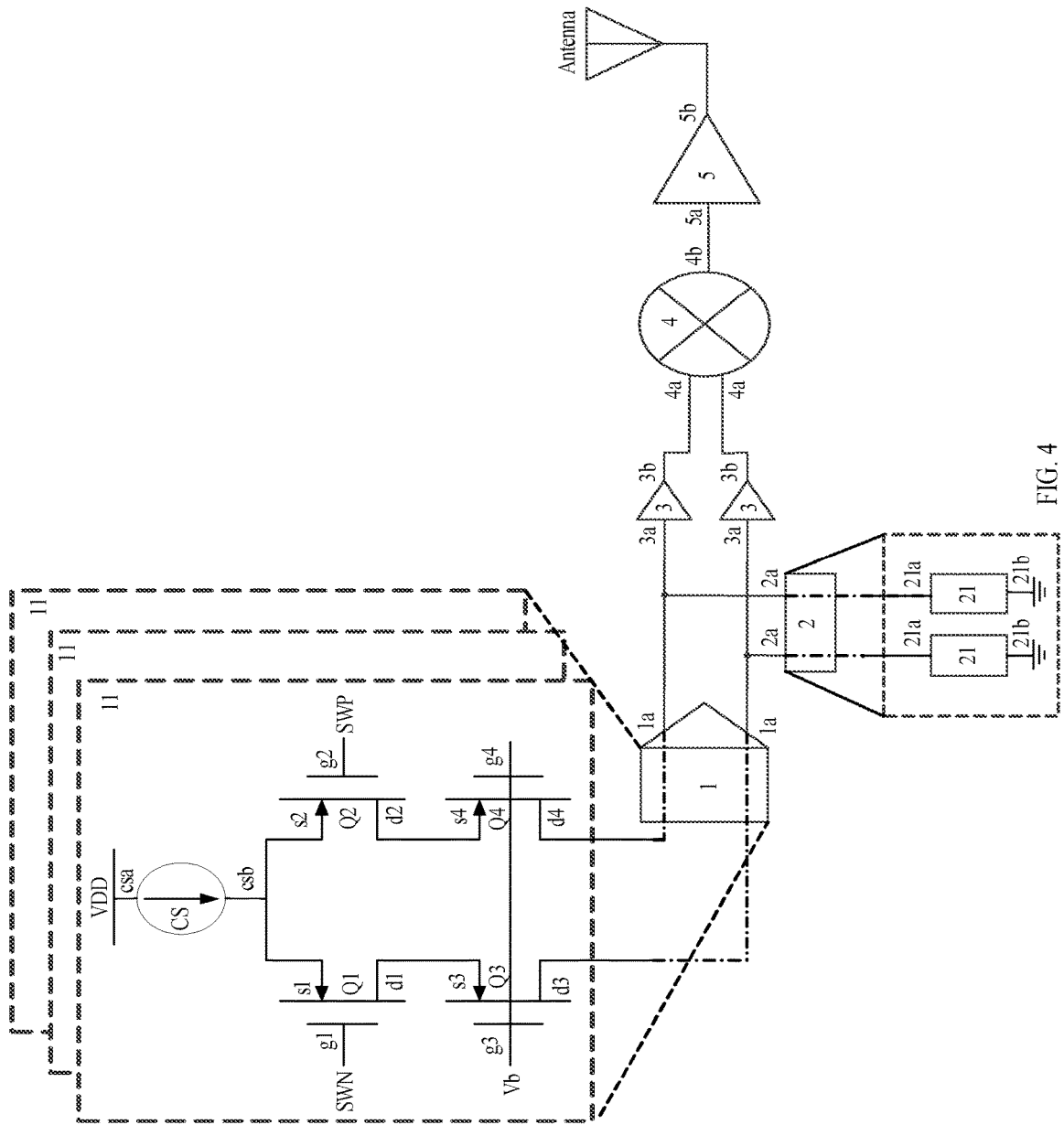
FIG. 4 is a schematic structural diagram of a third radio frequency transmitter according to an embodiment of the present disclosure.

Further, when the digital-to-analog converter 1 is of the first structure, referring to FIG. 4, the passive network 2 may include two passive units 21. Ends 21a of the two passive units 21 are respectively connected to the two output ends 1a of the digital-to-analog converter 1, and the other ends 21b of the two passive units 21 are grounded.

In this case, external power supplies VDD connected to the plurality of first current steering units 11 included in the digital-to-analog converter 1, the plurality of first current steering units 11, the two passive units 21 included in the passive network 2, and the ground connected to the two passive units 21 form a current loop such that the two passive units 21 can filter out the noise in the input current signal (that is, perform filtering processing on the current signal), and generate a voltage signal on one end 21a of each of the two passive units 21 (that is, convert the current signal into the voltage signal).

Figure 5:
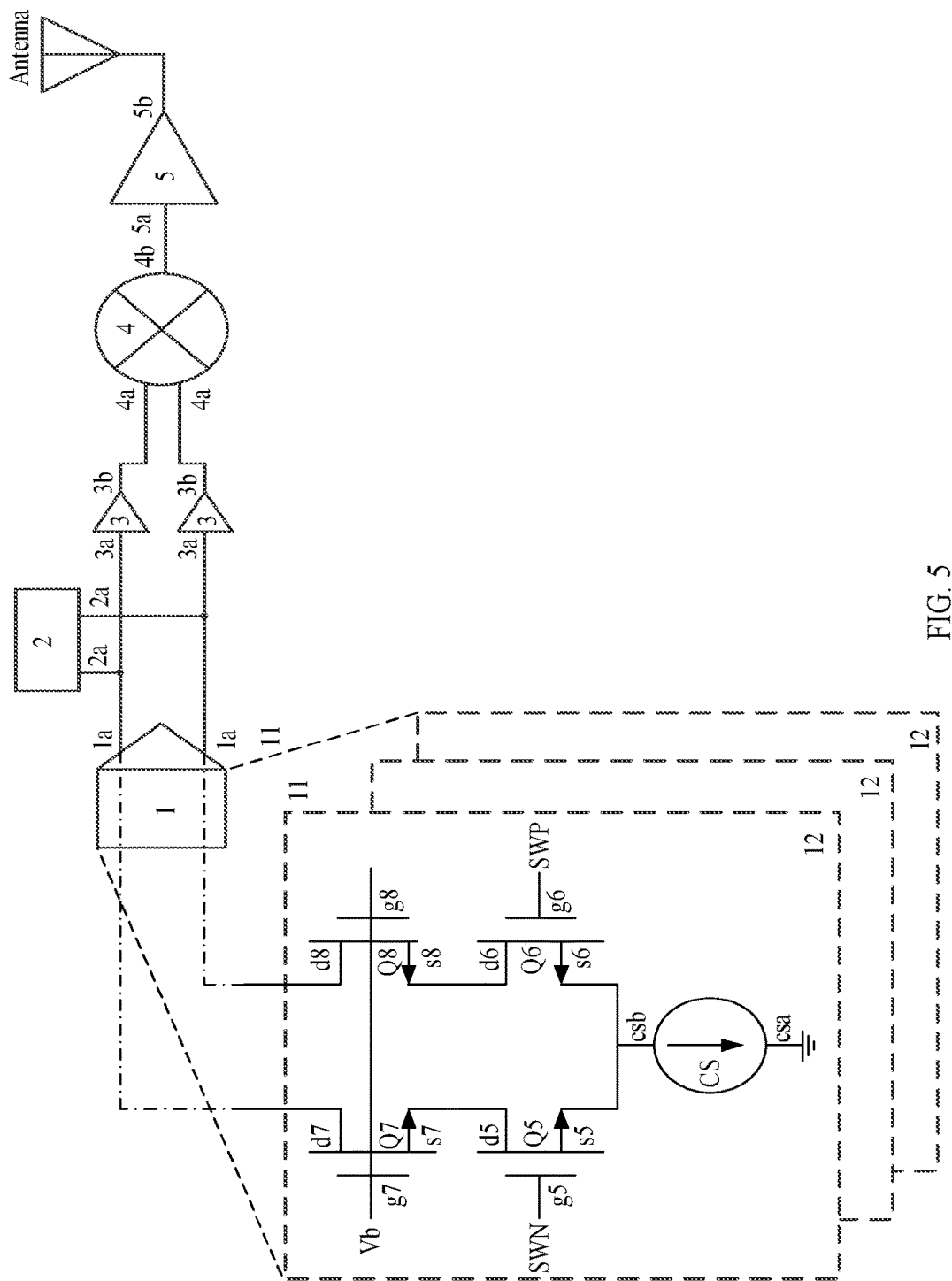
FIG. 5 is a schematic structural diagram of a fourth radio frequency transmitter according to an embodiment of the present disclosure.

Second structure: Referring to FIG. 5, the digital-to-analog converter 1 includes a plurality of second current steering units 12, and each second current steering unit 12 includes a current source CS, a first NMOS transistor Q5, a second NMOS transistor Q6, a third NMOS transistor Q7, and a fourth NMOS transistor Q8.

One end csa of the current source CS is grounded, and the other end csb of the current source CS is connected to both a source s5 of the first NMOS transistor Q5 and a source s6 of the second NMOS transistor Q6. A gate g5 of the first NMOS transistor Q5 is connected to a first signal source SWN, and the first NMOS transistor Q5 is connected forward in series to the third NMOS transistor Q7. A gate g6 of the second NMOS transistor Q6 is connected to a second signal source SWP, and the second NMOS transistor Q6 is connected forward in series to the fourth NMOS transistor Q8. A gate g7 of the third NMOS transistor Q7 is connected to a gate g8 of the fourth NMOS transistor Q8, and both the gate g7 of the third NMOS transistor Q7 and the gate g8 of the fourth NMOS transistor Q8 are connected to a third signal source Vb. A drain d7 of the third NMOS transistor Q7 and a drain d8 of the fourth NMOS transistor Q8 are respectively connected to the two input nodes 2a of the passive network 2, and the drain d7 of the third NMOS transistor Q7 and the drain d8 of the fourth NMOS transistor Q8 are respectively connected to the input ends 3a of the two buffers 3.

That the first NMOS transistor Q5 is connected forward in series to the third NMOS transistor Q7 means that a drain d5 of the first NMOS transistor Q5 is connected to a source s7 of the third NMOS transistor Q7. That the second NMOS transistor Q6 is connected forward in series to the fourth NMOS transistor Q8 means that a drain d6 of the second NMOS transistor Q6 is connected to a source s8 of the fourth NMOS transistor Q8.

The plurality of second current steering units 12 are in a one-to-one correspondence to a plurality of bits of the digital signal, and each of the plurality of second current steering units 12 is configured to convert a corresponding bit of the digital signal into one current signal. In this case, the current signal output by the digital-to-analog converter 1 is a sum of current signals output by the plurality of second current steering units 12.

The current source CS is configured to ensure constant current output of an external power supply VDD (see FIG. 6), that is, an output current of the external power supply VDD remains unchanged in a particular load changing range.

For each of the plurality of second current steering units 12, the first signal source SWN and the second signal source SWP that are connected to the second current steering unit output opposite levels. In this case, only one of the first NMOS transistor Q5 connected to the first signal source SWN and the second NMOS transistor Q6 connected to the second signal source SWP is closed at one time. For example, when the first signal source SWN outputs a high level, the second signal source SWP outputs a low level. In this case, the first NMOS transistor Q5 connected to the first signal source SWN is closed, and the second NMOS transistor Q6 connected to the second signal source SWP is open. When the first signal source SWN outputs a low level, the second signal source SWP outputs a high level. In this case, the first NMOS transistor Q5 connected to the first signal source SWN is open, and the second NMOS transistor Q6 connected to the second signal source SWP is closed.

In addition, the levels output by the first signal source SWN and the second signal source SWP that are connected to the second current steering unit are obtained based on the bit that is of the digital signal and that corresponds to the second current steering unit. Further, one of the first signal source SWN and the second signal source SWP that are connected to the second current steering unit may directly output a level corresponding to the bit that is of the digital signal and that corresponds to the second current steering unit, and the other signal source may output a level obtained after a phase inverter inverts a phase of the level corresponding to the bit that is of the digital signal and that corresponds to the second current steering unit.

The third NMOS transistor Q7 and the fourth NMOS transistor Q8 form a cascode transistor. The cascode transistor is disposed on an output branch of the current source such that an output resistance can be increased, thereby reducing impact caused by a change of an output voltage on an output current. That is, the cascode transistor including the third NMOS transistor Q7 and the fourth NMOS transistor Q8 is used to isolate the digital-to-analog converter 1 from the passive network 2 such that impact caused by fluctuation of the voltage signal output by the passive network 2 on the current signal output by the digital-to-analog converter 1 can be reduced to prevent the current signal output by the digital-to-analog converter 1 from generating a harmonic.

A level output by the third signal source Vb is generated by a bias circuit, and the third signal source Vb is configured to control closure of both the third NMOS transistor Q7 and the fourth NMOS transistor Q8 that are connected to the third signal source to ensure normal working of the third NMOS transistor Q7 and the fourth NMOS transistor Q8.

Figure 6:
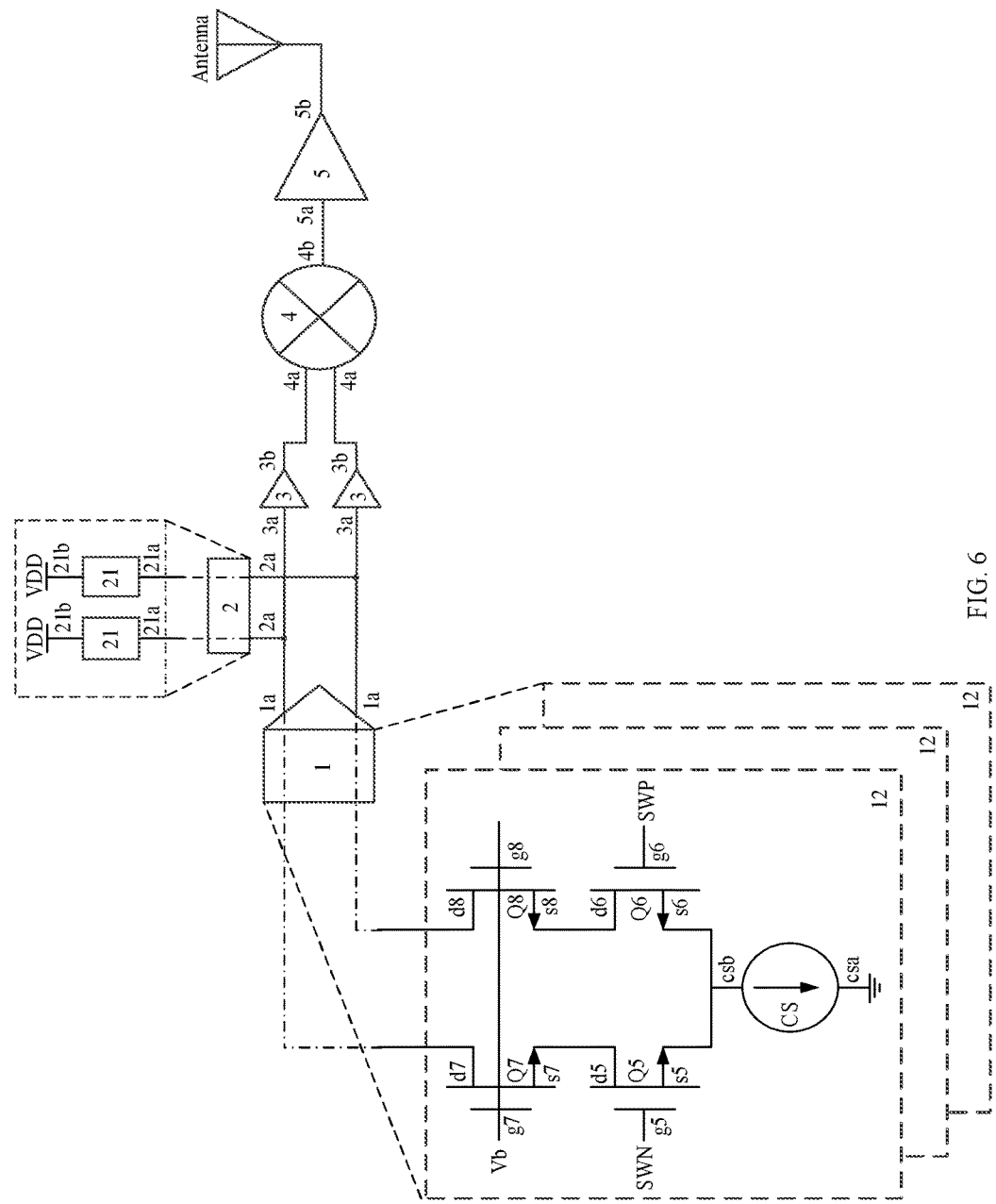
FIG. 6 is a schematic structural diagram of a fifth radio frequency transmitter according to an embodiment of the present disclosure.

Further, when the digital-to-analog converter 1 is of the second structure, referring to FIG. 6, the passive network 2 may include two passive units 21. Ends 21a of the two passive units 21 are respectively connected to the two output ends 1a of the digital-to-analog converter 1, and the other ends 21b of the two passive units 21 are connected to external power supplies VDD.

In this case, the ground connected to the plurality of second current steering units 12 included in the digital-to-analog converter 1, the plurality of second current steering units 12, the two passive units 21 included in the passive network 2, and the external power supplies VDD connected to the two passive units 21 form a current loop such that the two passive units 21 can filter out the noise in the input current signal, and generate a voltage signal on one end 21a of each of the two passive units 21.

Figure 7A:
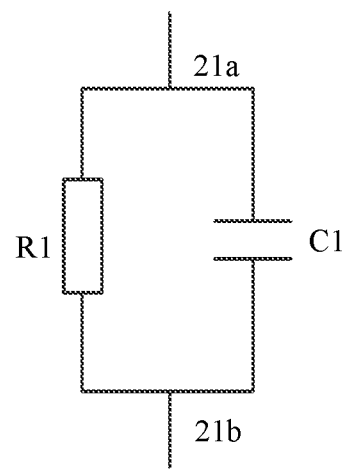
FIG. 7A is a schematic structural diagram of a passive unit according to an embodiment of the present disclosure.
Figure 7B:
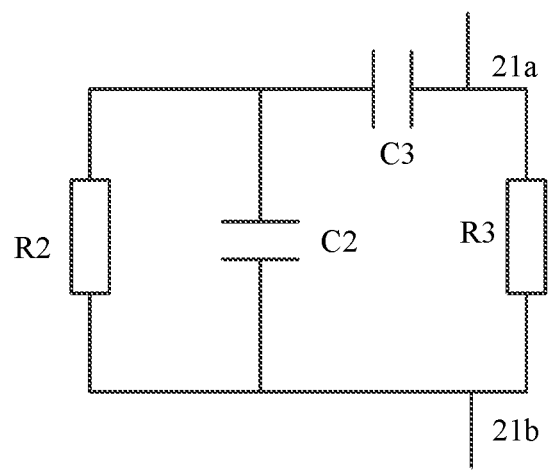
FIG. 7B is a schematic structural diagram of another passive unit according to an embodiment of the present disclosure.

The two passive units 21 in the foregoing two structures each may be a circuit including passive elements. For example, referring to FIG. 7A, each of the two passive units 21 includes a first resistor R1 and a first capacitor C1, and the first resistor R1 is connected in parallel to the first capacitor C1. Alternatively, referring to FIG. 7B, each of the two passive units 21 includes a second resistor R2, a third resistor R3, a second capacitor C2, and a third capacitor C3, the second resistor R2 is connected in parallel to the second capacitor C2, a circuit including the second resistor R2 and the second capacitor C2 is connected in series to the third capacitor C3, and a circuit including the second resistor R2, the second capacitor C2, and the third capacitor C3 is connected in parallel to the third resistor R3.

It should be noted that in actual application, the two passive units 21 may be alternatively set to be of another structure based on a specific application requirement provided that the structure can implement a function of filtering an input current signal and a function of converting the input current signal into a voltage signal.

Figure 8A:
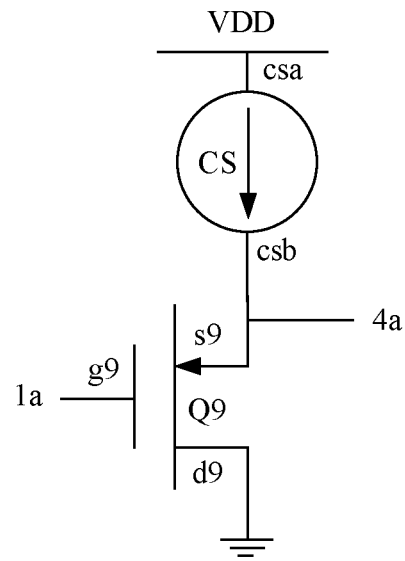
FIG. 8A is a schematic structural diagram of a buffer according to an embodiment of the present disclosure.
Figure 8B:
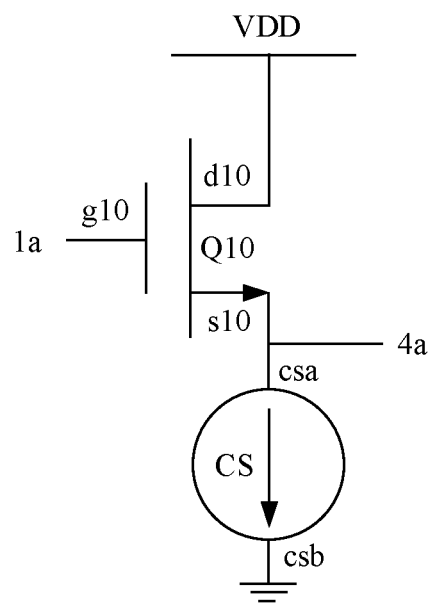
FIG. 8B is a schematic structural diagram of another buffer according to an embodiment of the present disclosure.

It should be noted that in actual application, the two buffers 3 each may be of a structure shown in FIG. 8A, or each may be of a structure shown in FIG. 8B. Certainly, the two buffers 3 each may be of another structure provided that the structure has a relatively large equivalent input impedance and can implement a function of isolating the digital-to-analog converter 1 from the frequency mixer 4.

Referring to FIG. 8A, each of the two buffers 3 includes a current source CS and a fifth PMOS transistor Q9. One end csa of the current source CS is connected to an external power supply VDD, and the other end csb of the current source CS is connected to both a source s9 of the fifth PMOS transistor Q9 and one input end 4a of the frequency mixer 4. A gate g9 of the fifth PMOS transistor Q9 is connected to one output end 1a of the digital-to-analog converter 1, and a drain d9 of the fifth PMOS transistor Q9 is grounded.

In this case, because the fifth PMOS transistor Q9 included in each of the two buffers 3 has a relatively large equivalent input impedance, the two buffers 3 can isolate the digital-to-analog converter 1 from the frequency mixer 4.

Referring to FIG. 8B, each of the two buffers 3 includes a current source CS and a fifth NMOS transistor Q10. A drain d10 of the fifth NMOS transistor Q10 is connected to an external power supply VDD, and a gate g10 of the fifth NMOS transistor Q10 is connected to one output end 1a of the digital-to-analog converter 1. One end csa of the current source CS is connected to both a source s10 of the fifth NMOS transistor Q10 and one input end 4a of the frequency mixer 4, and the other end csb of the current source CS is grounded.

In this case, because the fifth NMOS transistor Q10 included in each of the two buffers 3 has a relatively large equivalent input impedance, the two buffers 3 can isolate the digital-to-analog converter 1 from the frequency mixer 4.

In this embodiment of the present disclosure, the radio frequency transmitter includes the digital-to-analog converter, the passive network, the two buffers, the frequency mixer, and the power amplifier. When the radio frequency transmitter works, the digital-to-analog converter converts the to-be-transmitted digital signal into the current signal, and outputs the current signal to the passive network, the passive network performs filtering processing on the input current signal, and converts the current signal into the voltage signal and then outputs the voltage signal to the frequency mixer using the two buffers, the frequency mixer obtains the high frequency signal after performing frequency mixing on the input voltage signal and the local-frequency signal, and outputs the high frequency signal to the power amplifier, the power amplifier performs power amplification on the input high frequency signal, and then outputs the high frequency signal to the antenna, and the antenna transmits the high frequency signal. Because the passive network in the radio frequency transmitter includes no operational amplifier, compared with the solution that filtering and current-to-voltage conversion are performed using a trans-impedance amplifier, power consumption can be greatly reduced using the passive network provided in this embodiment of the present disclosure. In addition, because the two buffers in the radio frequency transmitter each are of the single-stage structure, power consumption of the two buffers all can be used to reduce noise generated by the two buffers. Therefore, compared with the solution that only first-stage power consumption of an operational amplifier included in a trans-impedance amplifier is used to reduce noise generated by the operational amplifier, the two buffers provided in this embodiment of the present disclosure can have a lower noise level and a higher bandwidth when power consumption of the two buffers is the same as that of the operational amplifier, and the two buffers have lower power consumption when a noise level of the two buffers is the same as that of the operational amplifier.

The foregoing descriptions are the embodiments provided in this application, but are not intended to limit this application. Any modification, equivalent replacement, improvement, or the like made without departing from the spirit and principle of this application should fall within the protection scope of this application.

What is claimed is:

1. A radio frequency transmitter, comprising:
    an antenna;
    a power amplifier comprising:
        a first input end; and
        a first output end configured to couple to the antenna;
    a frequency mixer comprising:
        a second input end;
        a third input end; and
        a second output end configured to couple to the first input end;
    a first buffer comprising:
        a fourth input end; and
        a third output end configured to couple to the second input end;
    a second buffer comprising:
        a fifth input end; and
        a fourth output end configured to couple to the third input end;
    a passive network comprising a first input node and a second input node and configured to:
        perform filtering processing on an input current signal; and
        convert the input current signal into a voltage signal; and
    a digital-to-analog converter comprising:
        a fifth output end configured to couple to the first input node and the fourth input end; and
        a sixth output end configured to couple to the second input node and fifth input end, wherein the first buffer further comprises:
            a P-type metal-oxide-semiconductor (PMOS) transistor comprising:
                a source;
                a gate configured to couple to the fifth output end; and
                a drain that is grounded; and
            a current source comprising:
                one end configured to couple to an external power supply; and
                another end configured to couple to the source and the second input end.

2. The radio frequency transmitter of claim 1, wherein the digital-to-analog converter further comprises a plurality of first current steering circuits, and wherein each of the first current steering circuits comprises:
    a first PMOS transistor comprising:
        a first source;
        a first gate configured to couple to a first signal source; and
        a first drain;
    a second PMOS transistor comprising:
        a second source;
        a second gate configured to couple to a second signal source; and
        a second drain;
    a second current source comprising:
        a first end configured to couple to an external power supply; and
        a second end configured to couple to the first source and the second source;
    a third PMOS transistor, wherein the first PMOS transistor is coupled forward in series to the third PMOS transistor, and wherein the third PMOS transistor comprises:
        a third source;
        a third gate configured to couple to a third signal source; and
        a third drain configured to couple to the first input node and the fourth input end; and
    a fourth PMOS transistor, wherein the second PMOS transistor is configured to couple forward in series to the fourth PMOS transistor, and wherein the fourth PMOS transistor comprises:
        a fourth source;
        a fourth gate configured to couple to the third gate and the third signal source; and
        a fourth drain configured to couple to the second input node and the fifth input end.

3. The radio frequency transmitter of claim 2, wherein the passive network further comprises:
    a first passive circuit comprising:
        a third end configured to couple to the fifth output end; and
        a fourth end that is grounded; and
    a second passive circuit comprising:
        a fifth end configured to couple to the sixth output end; and
        a sixth end that is grounded.

4. The radio frequency transmitter of claim 2, wherein the first drain is configured to couple to the third source, and wherein the second PMOS transistor is configured to couple forward in series to the fourth PMOS transistor comprises that the second drain is configured to couple to the fourth source.

5. The radio frequency transmitter of claim 3, wherein the first passive circuit comprises a first resistor and a first capacitor, and wherein the first resistor is configured to couple in parallel to the first capacitor.

6. The radio frequency transmitter of claim 3, wherein the second passive circuit comprises a first resistor and a first capacitor, and wherein the first resistor is configured to couple in parallel to the first capacitor.

7. The radio frequency transmitter of claim 3, wherein the first passive circuit comprises:
    a first capacitor;
    a first resistor configured to couple in parallel to the first capacitor to form a first circuit;
    a second capacitor configured to couple in series to the first circuit to form a second circuit; and
    a second resistor configured to couple in parallel to the second circuit.

8. The radio frequency transmitter of claim 3, wherein the second passive circuit comprises:
    a first capacitor;

a first resistor configured to couple in parallel to the first capacitor to form a first circuit;
a second capacitor configured to couple in series to the first circuit to form a second circuit; and
a second resistor configured to couple in parallel to the second circuit.

9. The radio frequency transmitter of claim 1, wherein the digital-to-analog converter further comprises a plurality of second current steering circuits, and wherein each of the second current steering circuits comprises:
a first N-type metal-oxide-semiconductor (NMOS) transistor;
a first source;
a first gate configured to couple to a first signal source; and
a first drain;
a second NMOS transistor;
a second source;
a second gate configured to couple to a second signal source; and
a second drain;
a second current source comprising:
a first end that is grounded; and
a second end configured to couple to the first source and the second source;
a third NMOS transistor, wherein the first NMOS transistor is configured to couple forward in series to the third NMOS transistor, and wherein the third NMOS transistor comprises:
a third source;
a third gate configured to couple to a third signal source; and
a third drain configured to couple to the first input node and the fourth input end; and
a fourth NMOS transistor, wherein the second NMOS transistor is configured to couple forward in series to the fourth NMOS transistor, and wherein the fourth NMOS transistor comprises:
a fourth source;
a fourth gate configured to couple to the third gate and the third signal source; and
a fourth drain configured to couple to the second input node and the fifth input end.

10. The radio frequency transmitter of claim 9, wherein the first drain is configured to couple to the third source, and wherein the second NMOS transistor is configured to couple forward in series to the fourth NMOS transistor comprises that the second drain is configured to couple to the fourth source.

11. The radio frequency transmitter of claim 9, wherein the passive network further comprises:
a first passive circuit comprising:
a third end configured to couple to the fifth output end; and
a fourth end configured to couple to a first external power supply; and
a second passive circuit comprising:
a fifth end configured to couple to the sixth output end; and
a sixth end configured to couple to a second external power supply.

12. The radio frequency transmitter of claim 11, wherein the first passive circuit comprises a first resistor and a first capacitor, and wherein the first resistor is configured to couple in parallel to the first capacitor.

13. The radio frequency transmitter of claim 11, wherein the second passive circuit comprises a first resistor and a first capacitor, and wherein the first resistor is configured to couple in parallel to the first capacitor.

14. The radio frequency transmitter of claim 11, wherein the first passive circuit comprises:
a first capacitor;
a first resistor configured to couple in parallel to the first capacitor to form a first circuit;
a second capacitor configured to couple in series to the first circuit to form a second circuit; and
a second resistor configured to couple in parallel to the second circuit.

15. The radio frequency transmitter of claim 11, wherein the second passive circuit comprises:
a first capacitor;
a first resistor configured to couple in parallel to the first capacitor to form a first circuit;
a second capacitor configured to couple in series to the first circuit to form a second circuit; and
a second resistor configured to couple in parallel to the second circuit.

16. The radio frequency transmitter of claim 1, wherein the first buffer and the second buffer are configured to isolate the digital-to-analog converter from the frequency mixer.

17. The radio frequency transmitter of claim 1, wherein the second buffer comprises:
a second P-type metal-oxide-semiconductor (PMOS) transistor comprising:
a second source;
a second gate configured to couple to the sixth output end; and
a second drain that is grounded; and
a second current source comprising:
a first end configured to couple to an external power supply; and
a second end configured to couple to the source and the third input end.

18. A radio frequency transmitter, comprising:
an antenna;
a power amplifier comprising:
a first input end; and
a first output end configured to couple to the antenna;
a frequency mixer comprising:
a second input end;
a third input end; and
a second output end configured to couple to the first input end;
a first buffer comprising:
a fourth input end; and
a third output end configured to couple to the second input end;
a second buffer comprising:
a fifth input end; and
a fourth output end configured to couple to the third input end;
a passive network comprising a first input node and a second input node and configured to:
perform filtering processing on an input current signal; and
convert the input current signal into a voltage signal; and
a digital-to-analog converter comprising:
a fifth output end configured to couple to the first input node and the fourth input end; and
a sixth output end configured to couple to the second input node and fifth input end, wherein the first buffer further comprises:

an N-type metal-oxide-semiconductor (NMOS) transistor comprising:
a source;
a gate configured to couple to the fifth output end; and
a drain configured to couple to an external power supply; and
a current source comprising:
a first end that is grounded; and
a second end configured to couple to the source and the second input end.

19. The radio frequency transmitter of claim 18, wherein the second buffer comprises:
a second NMOS transistor comprising:
a second source;
a second gate configured to couple to the sixth output end; and
a second drain configured to couple to an external power supply; and
a second current source comprising:
a third end that is grounded; and
a fourth end configured to couple to the source and the third input end.

20. The radio frequency transmitter of claim 18, wherein the first buffer and the second buffer are configured to isolate the digital-to-analog converter from the frequency mixer.

* * * * *